(12) United States Patent
Nomaru

(10) Patent No.: US 9,087,914 B2
(45) Date of Patent: Jul. 21, 2015

(54) WAFER PROCESSING METHOD

(71) Applicant: DISCO CORPORATION, Tokyo (JP)

(72) Inventor: Keiji Nomaru, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/478,202

(22) Filed: Sep. 5, 2014

(65) Prior Publication Data

US 2015/0072506 A1 Mar. 12, 2015

(30) Foreign Application Priority Data

Sep. 11, 2013 (JP) .................................. 2013-188414

(51) Int. Cl.
| | |
|---|---|
| *H01L 21/82* | (2006.01) |
| *H01L 21/268* | (2006.01) |
| *H01L 21/768* | (2006.01) |
| *H01L 21/304* | (2006.01) |
| *H01L 23/544* | (2006.01) |

(52) U.S. Cl.
CPC .............. *H01L 21/82* (2013.01); *H01L 21/268* (2013.01); *H01L 21/304* (2013.01); *H01L 21/76894* (2013.01); *H01L 23/544* (2013.01)

(58) Field of Classification Search
CPC ........... B32K 26/0057; B23K 26/4075; B23K 101/40; H01L 21/268; H01L 21/301; H01L 21/304; H01L 21/6894; H01L 21/78; H01L 23/544; H01L 23/5446
USPC ......................................... 438/113, 462, 463
See application file for complete search history.

(56) References Cited

U.S. PATENT DOCUMENTS 7,585,751 B2 * 9/2009 Kirihara et al. ................ 438/462

FOREIGN PATENT DOCUMENTS

JP 2009-021476 1/2009

* cited by examiner

*Primary Examiner* — Thanhha Pham
(74) *Attorney, Agent, or Firm* — Greer Burns & Crain Ltd.

(57) ABSTRACT

A wafer is divided into a plurality of individual devices along a plurality of crossing division lines formed on the front side of the wafer. The wafer has a substrate, a functional layer formed on the front side of the substrate, and an $SiO_2$ film formed on the front side of the functional layer. The individual devices are formed from the functional layer and partitioned by the division lines. The functional layer is removed by applying a laser beam to the wafer along each division line to thereby remove the functional layer along each division line. The laser beam has an absorption wavelength to the $SiO_2$ film with high absorptivity due to the stretching vibration of an O—H bond or a C—H bond remaining in the $SiO_2$ film. The wafer is then divided into the individual devices.

5 Claims, 9 Drawing Sheets

WAFER PROCESSING METHOD

BACKGROUND OF THE INVENTION

1. Field of the Invention

The present invention relates to a wafer processing method for dividing a wafer into a plurality of individual devices along a plurality of crossing division lines formed on the front side of the wafer, the wafer being composed of a substrate and a functional layer formed on the front side of the substrate, the individual devices being formed from the functional layer and partitioned by the division lines.

2. Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The plural devices are partitioned by a plurality of division lines formed on the front side of the semiconductor wafer. The semiconductor wafer is divided along these division lines to obtain the individual devices.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 µm, for example.

However, it is difficult to cut the low-k film mentioned above by using the cutting blade. That is, the low-k film is very brittle like mica. Accordingly, when the semiconductor wafer having the low-k film is cut along the division lines by using the cutting blade, there arises a problem such that the low-k film may be separated and this separation may reach the devices to cause fatal damage to the devices.

To solve this problem, Japanese Patent Laid-Open No. 2009-21476 discloses a wafer dividing method including the steps of applying a laser beam along both sides of each division line on a semiconductor wafer to form two laser processed grooves along each division line, thereby dividing a stacked layer and next positioning a cutting blade between the outer side walls of the two laser processed grooves along each division line to relatively move the cutting blade and the semiconductor wafer, thereby cutting the semiconductor wafer along each division line.

SUMMARY OF THE INVENTION

However, the functional layer including the low-k film is covered with an $SiO_2$ film. Accordingly, when a laser beam is applied to the functional layer, the laser beam passes through the $SiO_2$ film to reach the inside of the functional layer. As a result, heat is generated by the application of the laser beam to the low-k film and the substrate and this heat is confined in the functional layer by the $SiO_2$ film, so that there is a possibility of thermal expansion of the functional layer to cause the separation of the functional layer in the area where the circuits are formed and the density is low.

It is therefore an object of the present invention to provide a wafer processing method which can divide a wafer into the individual devices along the division lines without the separation of a functional layer in each device, wherein the wafer includes a substrate and the functional layer formed on the front side of the substrate and the devices are formed from this functional layer.

In accordance with an aspect of the present invention, there is provided a wafer processing method for dividing a wafer into a plurality of individual devices along a plurality of crossing division lines formed on the front side of the wafer, the wafer including a substrate, a functional layer formed on the front side of the substrate, and an $SiO_2$ film formed on the front side of the functional layer, the individual devices being formed from the functional layer and partitioned by the division lines, the wafer processing method including a functional layer removing step of applying a laser beam to the wafer along each division line to thereby remove the functional layer along each division line, the laser beam having an absorption wavelength to the $SiO_2$ film with high absorptivity due to the stretching vibration of an O—H bond or a C—H bond remaining in the $SiO_2$ film; and a wafer dividing step of processing the substrate along each division line where the functional layer has been removed by performing the functional layer removing step, thereby dividing the wafer into the individual devices.

Preferably, the wavelength of the laser beam to be applied in the functional layer removing step is set to 2.6 to 3.5 µm Preferably, the wafer dividing step includes the step of applying a laser beam having an absorption wavelength to the substrate along each division line where the functional layer has been removed, thereby ablating the substrate to form a division groove on the substrate along each division line.

As another preferred configuration, the wafer dividing step includes the step of applying a laser beam having a transmission wavelength to the substrate along each division line where the functional layer has been removed in the condition where a focal point of the laser beam is set inside the substrate, thereby forming a modified layer inside the substrate along each division line.

As still another preferred configuration, the wafer dividing step includes the step of aligning a cutting blade with each division line where the functional layer has been removed, thereby cutting the substrate along each division line.

In the functional layer removing step of the wafer processing method according to the present invention, the laser beam having an absorption wavelength to the $SiO_2$ film with high absorptivity due to the stretching vibration of the O—H bond or the C—H bond remaining in the $SiO_2$ film is applied to the wafer along each division line. Accordingly, when this laser beam is applied to the $SiO_2$ film formed on the front side of the functional layer, the laser beam is not passed through the $SiO_2$ film, but absorbed by the SiO₂ film. Accordingly, the SiO₂ film is ablated instantaneously and does not confine the heat inside the functional layer, thereby eliminating the possibility of separation of the functional layer in the area where the circuits are formed and the density is low.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
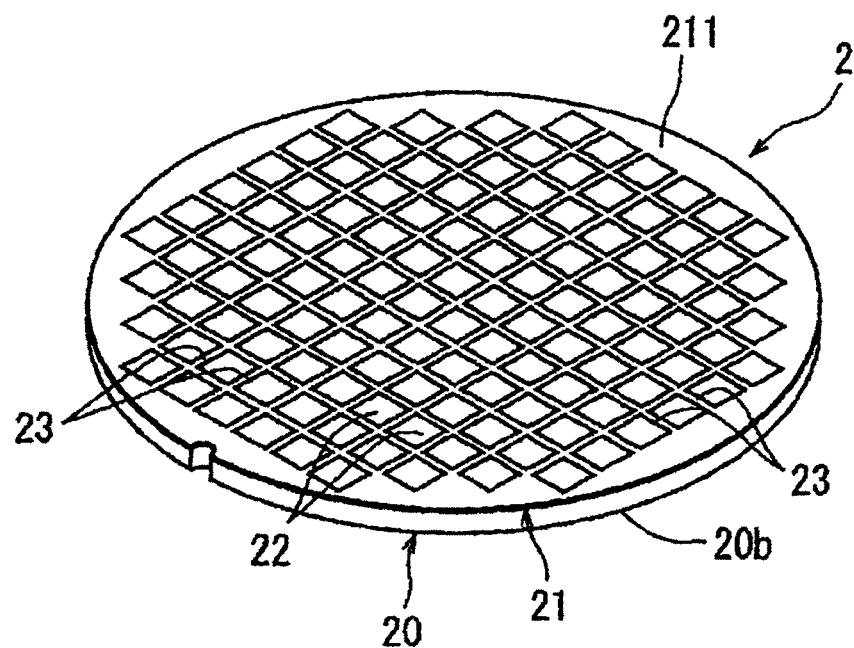
FIG. 1A is a perspective view of a semiconductor wafer to be divided by a wafer processing method according to the present invention.
Figure 1B:
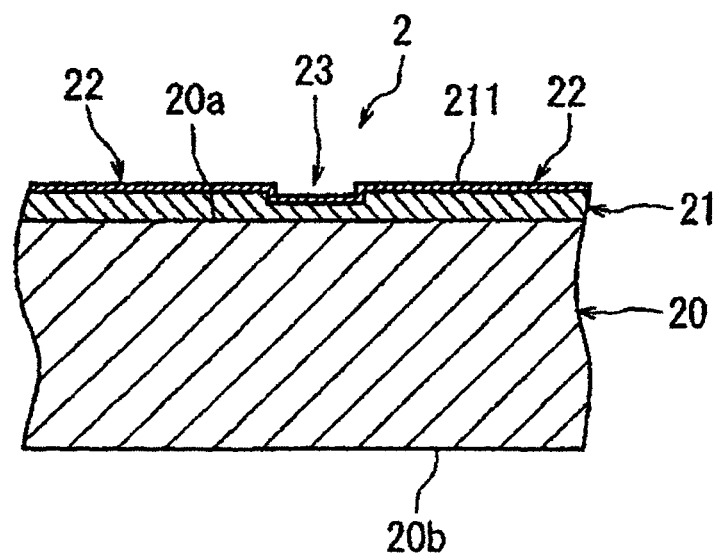
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual devices by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 formed on the front side 20a of the substrate 20. For example, the substrate 20 has a thickness of 140 μm. The functional layer 21 is composed of an insulating film and a functional film formed on the insulating film, the functional film forming a plurality of circuits. A plurality of devices 22 such as ICs and LSIs are formed like a matrix from the functional layer 21. These devices 22 are partitioned by a plurality of crossing division lines 23 formed on the functional layer 21. In this preferred embodiment, the insulating film constituting the functional layer 21 is provided by an SiO₂ film or a low-permittivity insulator film (low-k film).

Examples of the low-k film include an inorganic film of SiOF, BSG (SiOB), etc. and an organic film such as a polymer film of polyimide, parylene, etc. For example, the thickness of the insulating film is set to 10 μm. Further, an SiO₂ film 211 is formed on the front side of the functional layer 21. In forming the SiO₂ film 211, an O—H bond or a C—H bond in a required raw material is precipitated, so that the O—H bond or the C—H bond remains in the SiO₂ film 211.

Figure 2:
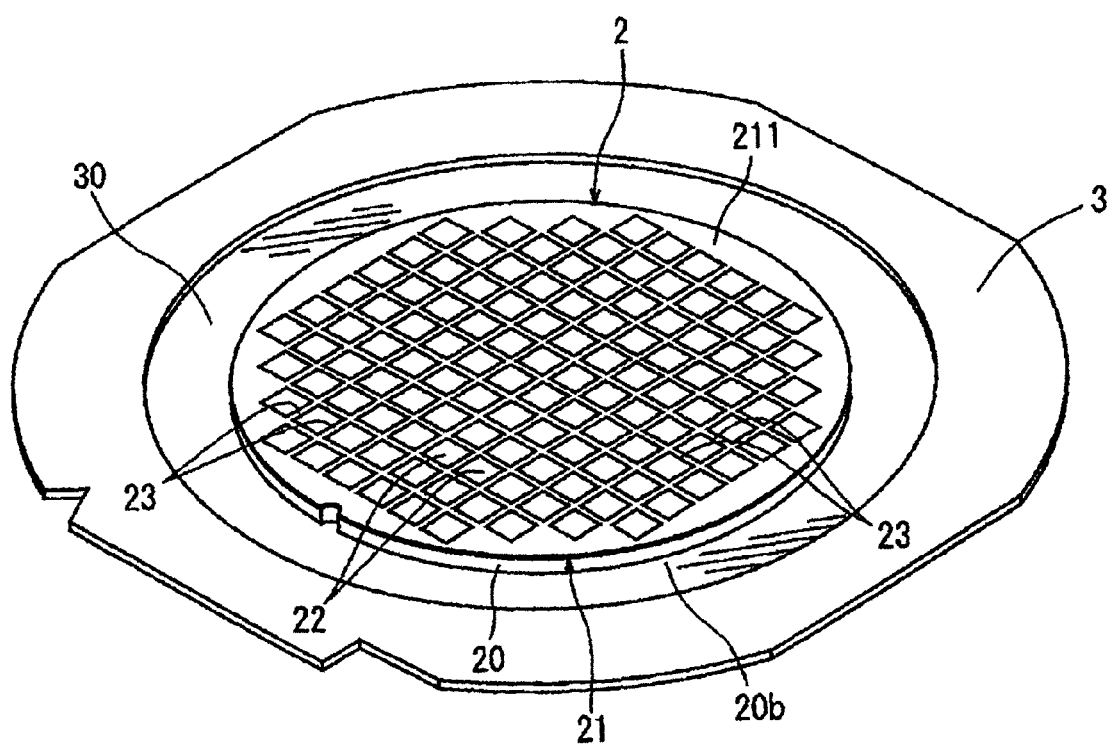
FIG. 2 is a perspective view showing a condition where the semiconductor wafer which a wafer supporting step is performed is attached to a dicing tape supported to an annular frame.

The wafer processing method for dividing the semiconductor wafer 2 along the division lines 23 will now be described. First, a wafer supporting step is performed in such a manner that a back side 20b of the substrate 20 constituting the semiconductor wafer 2 is attached to a dicing tape supported to an annular frame. More specifically, as shown in FIG. 2, a dicing tape 30 is supported at its peripheral portion to an annular frame 3 so as to close the inside opening of the annular frame 3. The back side 20b of the substrate 20 constituting the semiconductor wafer 2 is attached to the front side (upper surface) of the dicing tape 30 supported to the annular frame 3. Accordingly, the semiconductor wafer 2 is supported through the dicing tape 30 to the annular frame 3 in the condition where the SiO₂ film 211 formed on the front side of the functional layer 21 is oriented upward.

Figure 3:
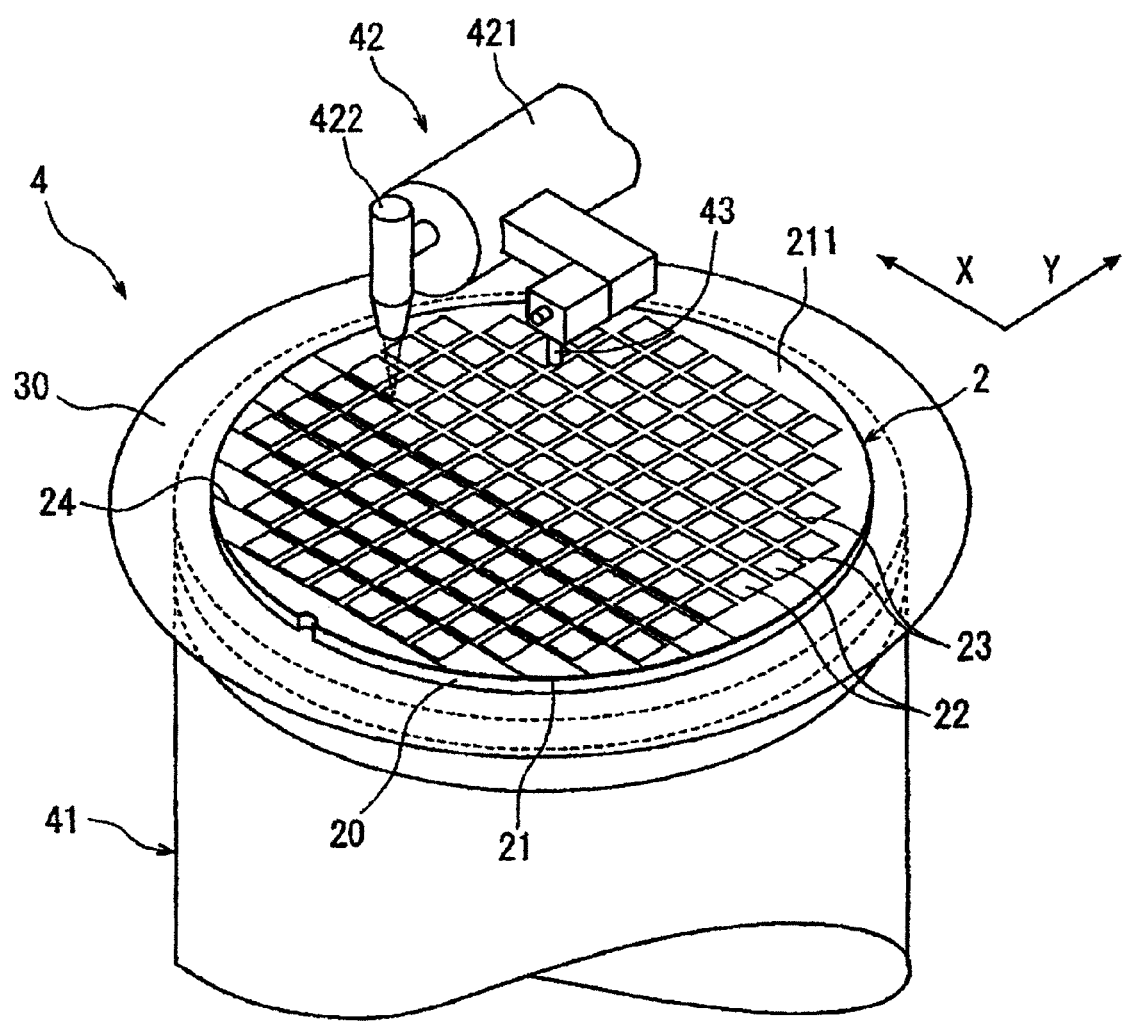
FIG. 3 is a perspective view of an essential part of a laser processing apparatus for performing a functional layer removing step.

After performing the wafer supporting step mentioned above, a functional layer removing step is performed in such a manner that a laser beam having an absorption wavelength to the SiO₂ film 211 with high absorptivity due to the stretching vibration of the O—H bond or the C—H bond remaining in the SiO₂ film 211 is applied along each division line 23 of the semiconductor wafer 2 to remove the functional layer 21 along each division line 23. This functional layer removing step is performed by using a laser processing apparatus 4 shown in FIG. 3. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser oscillator and repetition frequently setting means. The laser beam applying means 42 further includes focusing means 422 mounted on the front end of the casing 421 for focusing a pulsed laser beam oscillated by the pulsed laser beam oscillating means. The laser beam applying means 42 further includes focal position adjusting means (not shown) for adjusting the focal position of the pulsed laser beam to be focused by the focusing means 422.

The imaging means 43 is mounted on a front end portion of the casing 421 constituting the laser beam applying means 42 and includes illuminating means for illuminating the workpiece, an optical system for capturing an area illuminated by the illuminating means, and an imaging device (CCD) for imaging the area captured by the optical system. An image signal output from the imaging means 43 is transmitted to control means (not shown).

There will now be described with reference to FIG. 3 and FIGS. 4A to 4C the functional layer removing step of applying a laser beam to the semiconductor wafer 2 along each division line 23 by using the laser processing apparatus 4 mentioned above to thereby remove the functional layer 21 along each division line 23, the laser beam having an absorption wavelength to the $SiO_2$ film 211 with high absorptivity due to the stretching vibration of the O—H bond or the C—H bond remaining in the $SiO_2$ film 211. First, the semiconductor wafer 2 is placed on the chuck table 41 of the laser processing apparatus 4 in the condition where the dicing tape 30 attached to the semiconductor wafer 2 is in contact with the chuck table 41 as shown in FIG. 3. Thereafter, suction means (not shown) is operated to hold the semiconductor wafer 2 through the dicing tape 30 on the chuck table 41 under suction (wafer holding step). Accordingly, the $SiO_2$ film 211 formed on the front side of the functional layer 21 of the semiconductor wafer 2 held on the chuck table 41 is oriented upward. Although the annular frame 3 supporting the dicing tape 30 is not shown in FIG. 3, the annular frame 3 is held by suitable frame holding means provided on the chuck table 41. Thereafter, the chuck table 41 holding the semiconductor wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the semiconductor wafer 2 to be laser-processed. More specifically, the imaging means 43 and the control means perform image processing such as pattern matching for making the alignment of the division lines 23 in a first direction on the functional layer 21 of the semiconductor wafer 2 and the focusing means 422 of the laser beam applying means 42 for applying the laser beam to the wafer 2 along the division lines 23, thus performing the alignment of a laser beam applying position (alignment step). Similarly, the alignment of a laser beam applying position is performed for the other division lines 23 extending in a second direction perpendicular to the first direction on the functional layer 21.

Figure 4A:
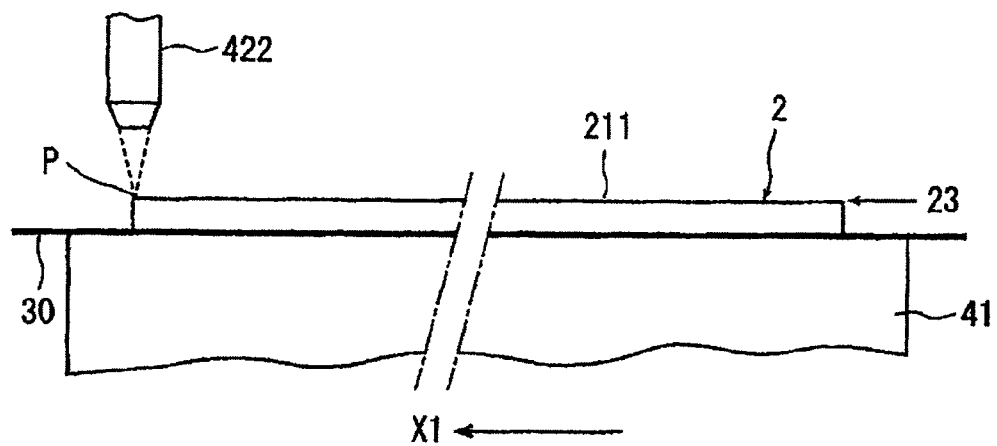
FIGS. 4A to 4C are views for illustrating the functional layer removing step.
Figure 4B:
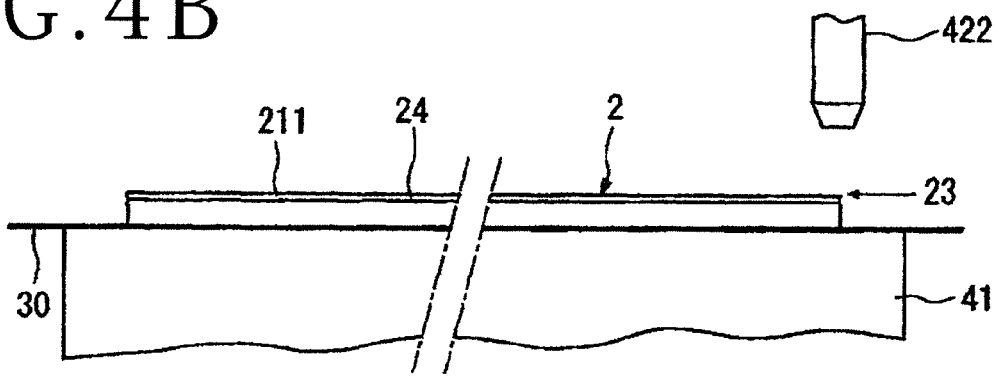
Figure 4C:
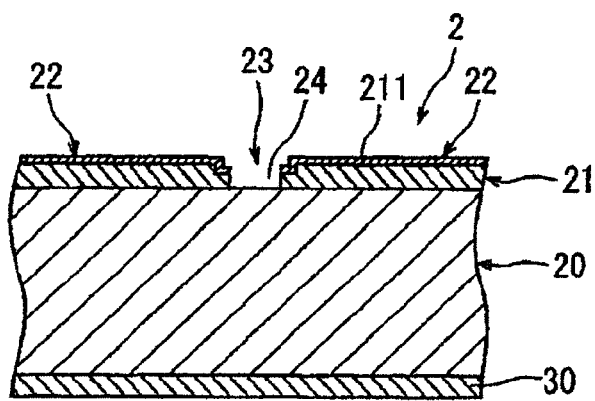

After performing the alignment step mentioned above, the chuck table 41 is moved to a laser beam applying area where the focusing means 422 of the laser beam applying means 42 is located as shown in FIG. 4A, thereby positioning one end (left end as viewed in FIG. 4A) of a predetermined one of the division lines 23 directly below the focusing means 422. Further, a focal point P of the pulsed laser beam to be applied from the focusing means 422 is set near the upper surface of the $SiO_2$ film 211 in the predetermined division line 23. Thereafter, the pulsed laser beam having an absorption wavelength to the $SiO_2$ film 211 with high absorptivity due to the stretching vibration of the O—H bond or the C—H bond remaining in the $SiO_2$ film 211 is applied from the focusing means 422 to the wafer 2, and the chuck table 41 is moved in the direction shown by an arrow X1 in FIG. 4A at a predetermined feed speed. When the other end (right end as viewed in FIG. 4B) of the predetermined division line 23 reaches the position directly below the focusing means 422 as shown in FIG. 4B, the application of the pulsed laser beam is stopped and the movement of the chuck table 41 is also stopped. As a result, the functional layer 21 is removed along the predetermined division line 23 of the semiconductor wafer 2 to form a laser processed groove 24 as shown in FIG. 4C. This functional layer removing step is similarly performed along all of the division lines 23 formed on the semiconductor wafer 2.

In the functional layer removing step mentioned above, the laser beam applying means 42 applies the pulsed laser beam having an absorption wavelength to the $SiO_2$ film 211 with high absorptivity due to the stretching vibration of the O—H bond or the C—H bond remaining in the $SiO_2$ film 211. Band gaps of the O—H bond and the C—H bond have peaks in a region of 2.6 to 3.5 μm. Therefore, as the pulsed laser beam having an absorption wavelength to the $SiO_2$ film 211 with high absorptivity due to the stretching vibration of the O—H bond or the C—H bond remaining in the $SiO_2$ film 211, a pulsed laser beam having a wavelength of 2.6 to 3.5 μm is applied. As a result, when the pulsed laser beam is applied to the $SiO_2$ film 211 formed on the front side of the functional layer 21, the pulsed laser beam is not passed through the $SiO_2$ film 211, but absorbed by the $SiO_2$ film 211. Accordingly, the $SiO_2$ film 211 is ablated instantaneously and does not confine the heat inside the functional layer 21, thereby eliminating the possibility of separation of the functional layer 21 in the area where the circuits are formed and the density is low.

For example, the functional layer removing step mentioned above is performed under the following processing conditions.

Light source: Er: YAG laser
Wavelength of the laser beam: 2.7 μm
Repetition frequency: 50 kHz
Average power: 0.5 W
Focused spot diameter: φ50 μm
Work feed speed: 200 mm/second After performing the functional layer removing step mentioned above, a wafer dividing step is performed in such a manner that the substrate 20 is processed along each division line 23 where the functional layer 21 has been removed by performing the functional layer removing step, thereby dividing the semiconductor wafer 2 into the individual devices 22. A first preferred embodiment of this wafer dividing step will now be described with reference to FIG. 5 and FIGS. 6A to 6C.

Figure 5:
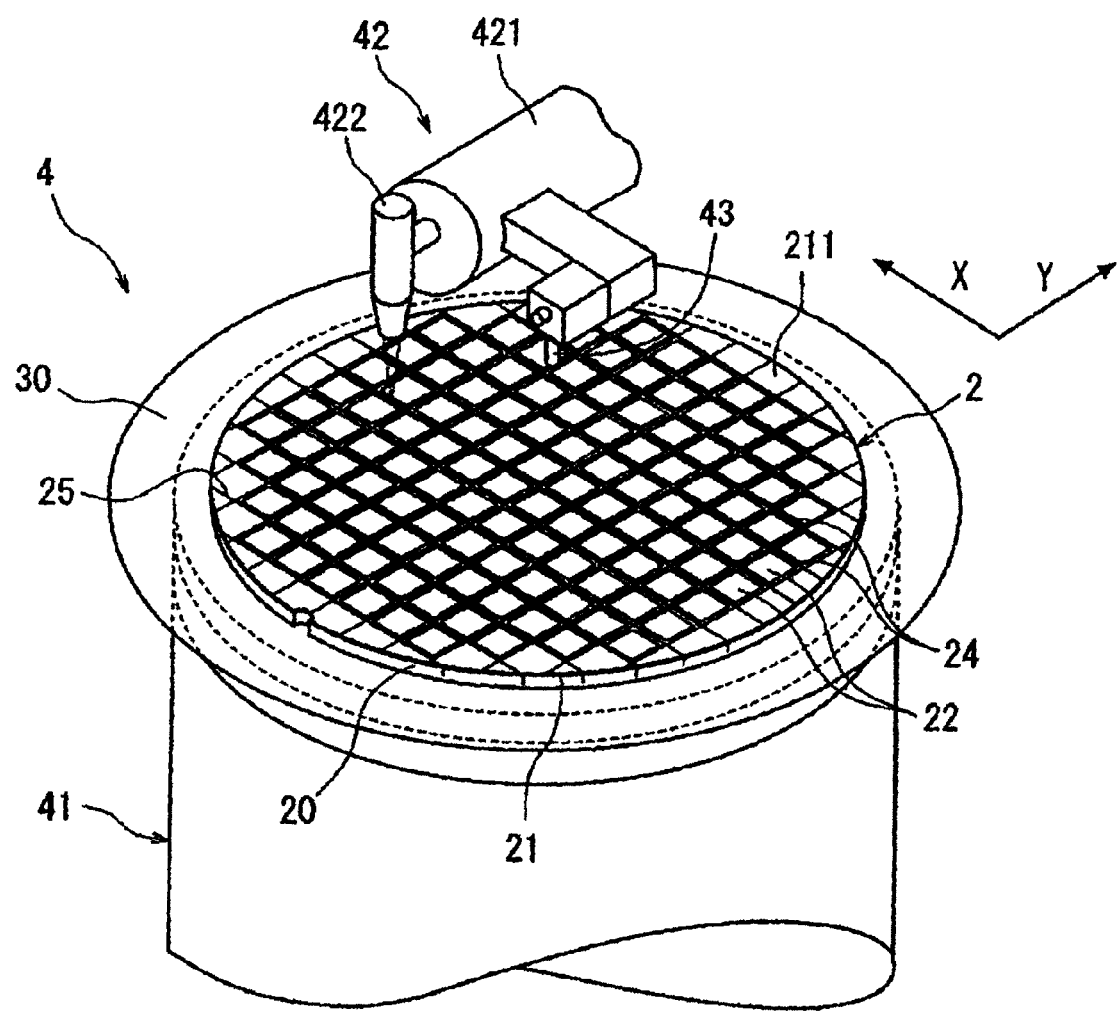
FIG. 5 is a perspective view of an essential part of a laser processing apparatus for performing a first preferred embodiment of a wafer dividing step.

The first preferred embodiment of the wafer processing step is the step of applying a laser beam having an absorption wavelength to the substrate 20 along each division line 23 where the functional layer 21 has been removed, thereby ablating the substrate 20 to form a division groove on the substrate 20 along each division line 23 (division groove forming step). This division groove forming step may be performed by using a laser processing apparatus similar to the laser processing apparatus 4 shown in FIG. 3. Such a similar laser processing apparatus is shown in FIG. 5 and the same reference numerals as those shown in FIG. 3 are used in FIG. 5 for convenience of illustration. In performing the division groove forming step, the semiconductor wafer 2 processed by the functional layer removing step is placed on the chuck table 41 in the condition where the dicing tape 30 attached to the semiconductor wafer 2 is in contact with the chuck table 41 as shown in FIG. 5. Thereafter, suction means (not shown) is operated to hold the semiconductor wafer 2 through the dicing tape 30 on the chuck table 41 under suction (wafer holding step). Accordingly, the $SiO_2$ film 211 formed on the front side of the functional layer 21 of the semiconductor wafer 2 held on the chuck table 41 is oriented upward. Although the annular frame 3 supporting the dicing tape 30 is not shown in FIG. 5, the annular frame 3 is held by suitable frame holding means provided on the chuck table 41. Thereafter, the chuck table 41 holding the semiconductor wafer 2 is moved to a position directly below the imaging means 43 by operating the feeding means (not shown). Thereafter, an alignment step is performed in the same manner as that mentioned above.

Figure 6A:
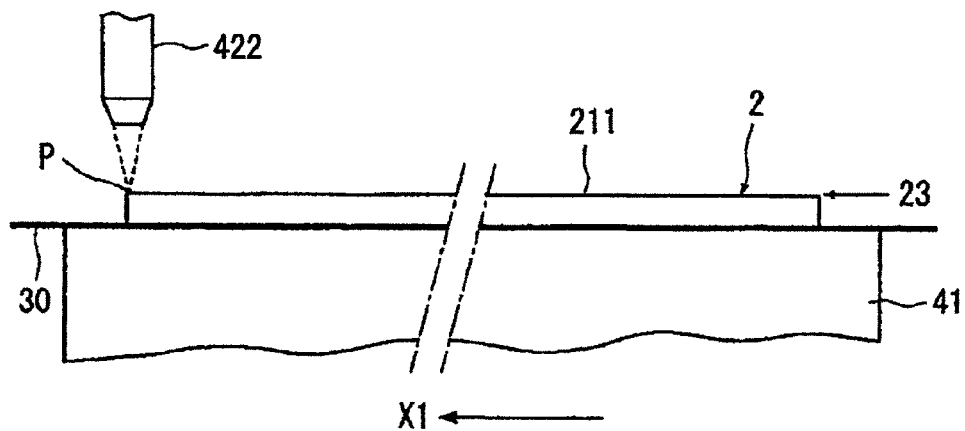
FIGS. 6A to 6C are views for illustrating a division groove forming step as the first preferred embodiment of the wafer dividing step.
Figure 6B:
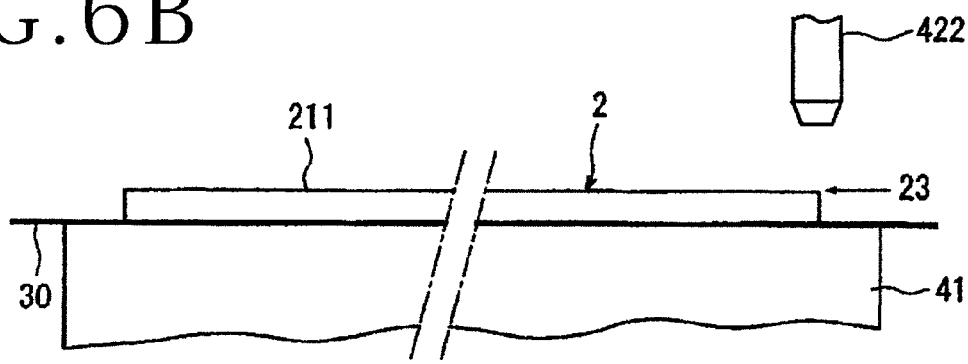

Thereafter, the chuck table 41 is moved to a laser beam applying area where the focusing means 422 of the laser beam applying means 42 is located as shown in FIG. 6A, thereby positioning a predetermined one of the division lines 23 directly below the focusing means 422, wherein the lateral center position of the laser processed groove 24 formed along the predetermined division line 23 is set as a laser beam applying position where the laser beam is applied from the focusing means 422. At this time, one end (left end as viewed in FIG. 6A) of the predetermined division line 23 is positioned directly below the focusing means 422. Further, a focal point P of the pulsed laser beam to be applied from the focusing means 422 is set near the front side (upper surface) of the substrate 20 in the predetermined division line 23 where the functional layer 21 has been removed. Thereafter, the pulsed laser beam is applied from the focusing means 422 to the wafer 2, and the chuck table 41 is moved in the direction shown by an arrow X1 in FIG. 6A at a predetermined feed speed. In this division groove forming step, the wavelength of the pulsed laser beam is set to an absorption wavelength to the substrate 20. When the other end (right end as viewed in FIG. 6B) of the predetermined division line 23 reaches the position directly below the focusing means 422 as shown in FIG. 6B, the application of the pulsed laser beam is stopped and the movement of the chuck table 41 is also stopped.

Figure 6C:
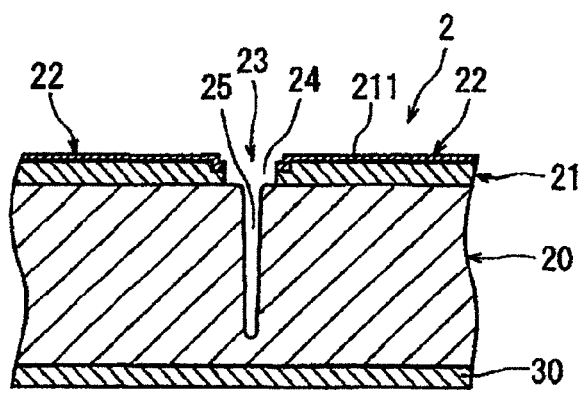

By performing the division groove forming step, a division groove 25 having a predetermined depth is formed in the substrate 20 along the laser processed groove 24 formed along the predetermined division line 23 as shown in FIG. 6C. The division groove forming step mentioned above is similarly performed along all of the division lines 23 of the semiconductor wafer 2 processed by the functional layer removing step.

For example, the division groove forming step mentioned above is performed under the following processing conditions.

Light source: YAG laser
Wavelength: 355 nm (third harmonic generation of YAG laser)
Repetition frequency: 100 kHz
Average power: 1.2 W
Focused spot diameter: $\phi$10 μm
Work feed speed: 200 mm/second After performing the division groove forming step as mentioned above, an external force is applied to the semiconductor wafer 2 to thereby divide the semiconductor wafer 2 along each division line 23 where the division groove 25 is formed. That is, since the division groove 25 as a division start point is formed along each division line 23 on the semiconductor wafer 2, the semiconductor wafer 2 can be easily divided along each division line 23 by applying the external force. As a modification, the division groove 25 may be formed over the entire thickness of the substrate 20 of the semiconductor wafer 2 along each division line 23 in the division groove forming step, thereby cutting the substrate 20 along each division line 23.

A second preferred embodiment of the wafer dividing step will now be described with reference to FIGS. 7A to 7C. The second preferred embodiment of the wafer dividing step is the step of applying a laser beam having a transmission wavelength to the substrate 20 along each division line 23 where the functional layer 21 has been removed in the condition where a focal point of the laser beam is set inside the substrate 20, thereby forming a modified layer inside the substrate 20 along each division line 23 (modified layer forming step). This modified layer forming step may be performed by using a laser processing apparatus similar to the laser processing apparatus 4 shown in FIG. 3 or FIG. 5. In performing the modified layer forming step, the semiconductor wafer 2 processed by the functional layer removing step is placed on the chuck table 41 in the condition where the dicing tape 30 attached to the semiconductor wafer 2 is in contact with the chuck table 41 as in the division groove forming step shown FIG. 5. Thereafter, suction means (not shown) is operated to hold the semiconductor wafer 2 through the dicing tape 30 on the chuck table 41 under suction (wafer holding step). Accordingly, the $SiO_2$ film 211 formed on the front side of the functional layer 21 of the semiconductor wafer 2 held on the chuck table 41 is oriented upward. Thereafter, an alignment step is performed in the same manner as that mentioned above.

Figure 7A:
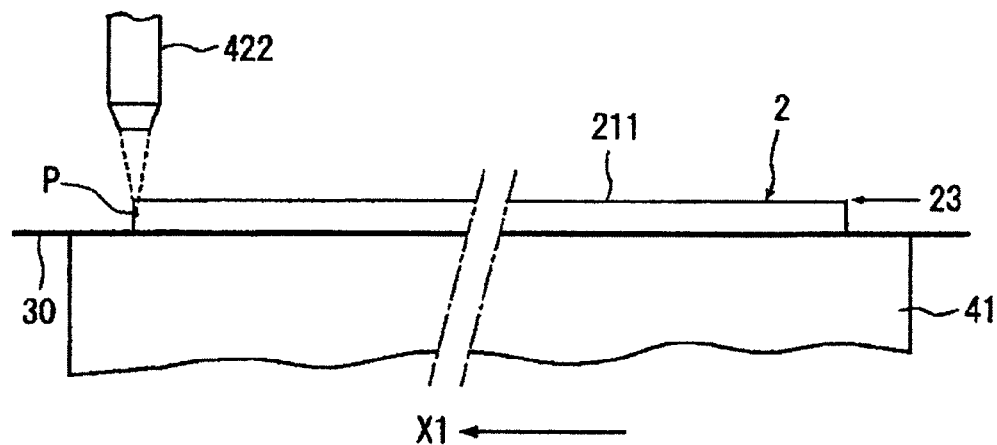
FIGS. 7A to 7C are views for illustrating a modified layer forming step as a second preferred embodiment of the wafer dividing step.
Figure 7B:
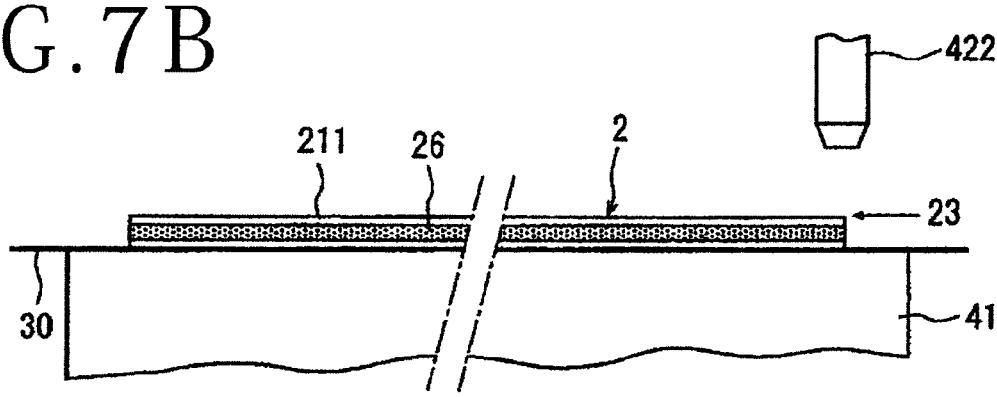

Thereafter, the chuck table 41 is moved to a laser beam applying area where the focusing means 422 of the laser beam applying means 42 is located as shown in FIG. 7A, thereby positioning a predetermined one of the division lines 23 directly below the focusing means 422, wherein the lateral center position of the laser processed groove 24 formed along the predetermined division line 23 is set as a laser beam applying position where the laser beam is applied from the focusing means 422. At this time, one end (left end as viewed in FIG. 7A) of the predetermined division line 23 is positioned directly below the focusing means 422. Further, a focal point P of the pulsed laser beam to be applied from the focusing means 422 is set inside the substrate 20 at an intermediate position in the direction along the thickness of the substrate 20. Thereafter, the pulsed laser beam is applied from the focusing means 422 to the wafer 2, and the chuck table 41 is moved in the direction shown by an arrow X1 in FIG. 7A at a predetermined feed speed. In this modified layer forming step, the wavelength of the pulsed laser beam is set to a transmission wavelength to the substrate 20. When the other end (right end as viewed in FIG. 7B) of the predetermined division line 23 reaches the position directly below the focusing means 422 as shown in FIG. 7B, the application of the pulsed laser beam is stopped and the movement of the chuck table 41 is also stopped.

Figure 7C:
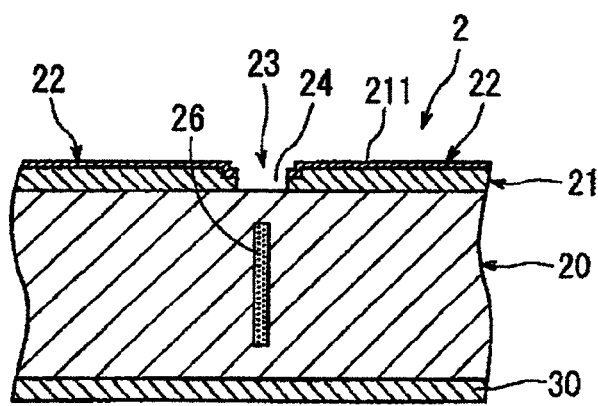

By performing the modified layer forming step, a modified layer 26 is formed in the substrate 20 along the laser processed groove 24 formed along the predetermined division line 23 as shown in FIG. 7C. The modified layer forming step mentioned above is similarly performed along all of the division lines 23 of the semiconductor wafer 2 processed by the functional layer removing step.

For example, the modified layer forming step mentioned above is performed under the following processing conditions.

Light source: YAG laser
Wavelength: 1064 nm
Repetition frequency: 100 kHz
Average power: 0.3 W
Focused spot diameter: $\phi$1 μm
Work feed speed: 200 mm/second After performing the modified layer forming step as mentioned above, an external force is applied to the semiconductor wafer 2 to thereby divide the semiconductor wafer 2 along each division line 23 where the modified layer 26 is formed. That is, since the modified layer 26 as a division start point is formed along each division line 23 on the semiconductor wafer 2, the semiconductor wafer 2 can be easily divided along each division line 23 by applying the external force. As a modification, the modified layer 26 may be formed over the entire thickness of the substrate 20 of the semiconductor wafer 2 along each division line 23 in the modified layer forming step, thereby almost dividing the substrate 20 along each division line 23.

Figure 8:
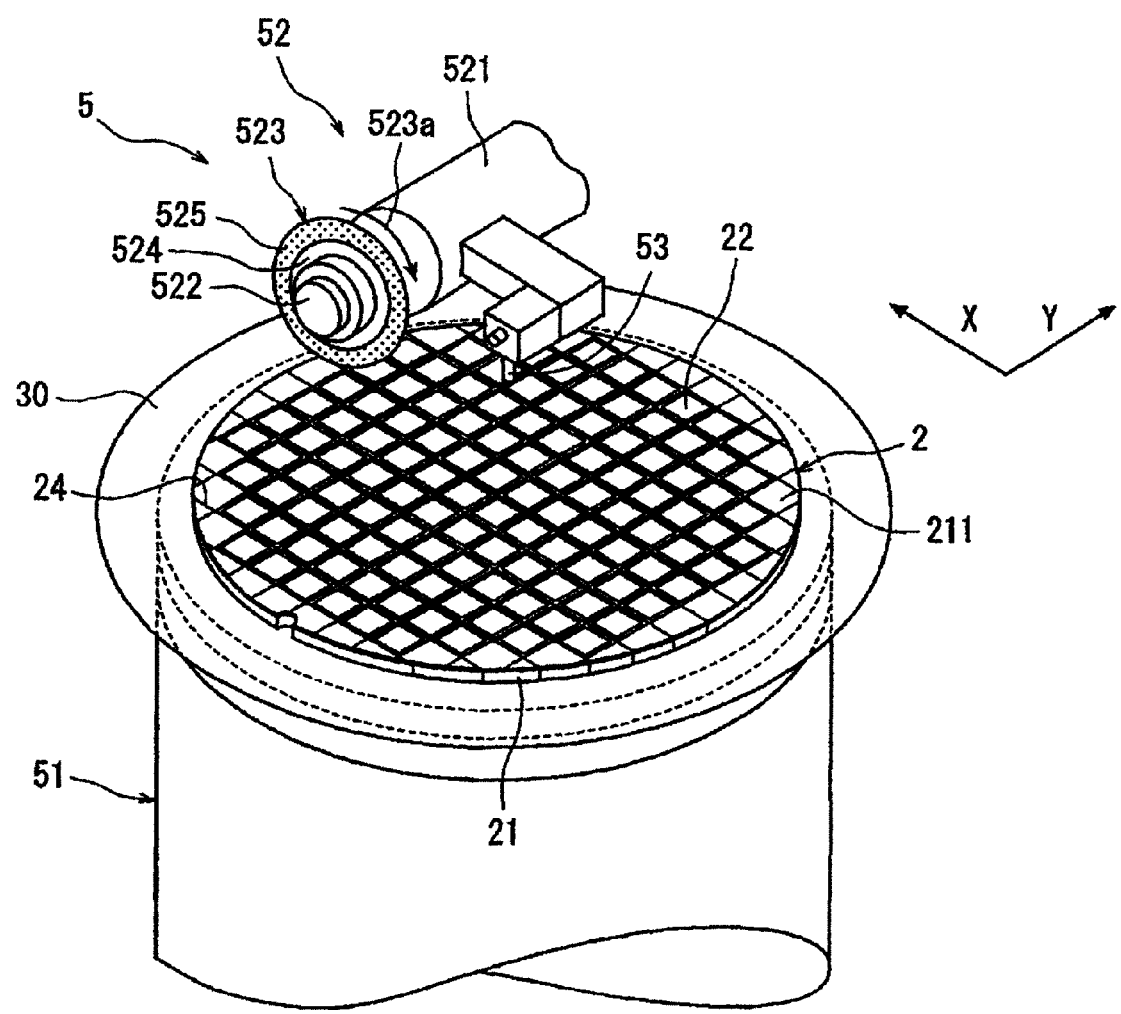
FIG. 8 is a perspective view of an essential part of a cutting apparatus for performing a third preferred embodiment of the wafer dividing step.

A third preferred embodiment of the wafer dividing step will now be described with reference to FIG. 8 and FIGS. 9A to 9D. The third preferred embodiment of the wafer dividing step is the step of aligning a cutting blade with each division line 23 where the functional layer 21 has been removed, thereby cutting the substrate 20 along each division line 23 (cut groove forming step). This cut groove forming step is performed by using a cutting apparatus 5 shown in FIG. 8. As shown in FIG. 8, the cutting apparatus 5 includes a chuck table 51 for holding a workpiece, cutting means 52 for cutting the workpiece held on the chuck table 51, and imaging means 53 for imaging the workpiece held on the chuck table 51. The chuck table 51 has an upper surface as a holding surface for holding the workpiece thereon under suction. The chuck table 51 is movable both in the feeding direction shown by an arrow X in FIG. 8 by feeding means (not shown) and in the indexing direction shown by an arrow Y in FIG. 8 by indexing means (not shown).

The cutting means 52 includes a spindle housing 521 extending in a substantially horizontal direction, a rotating spindle 522 rotatably supported to the spindle housing 521, and a cutting blade 523 mounted on the rotating spindle 522 at a front end portion thereof. The rotating spindle 522 is adapted to be rotated in the direction shown by an arrow 523a by a servo motor (not shown) provided in the spindle housing 521. The cutting blade 523 is composed of a disk-shaped base 524 formed of aluminum and an annular cutting edge 525 mounted on one side surface of the base 524 along the outer circumference thereof. The annular cutting edge 525 is an electroformed diamond blade produced by bonding diamond abrasive grains having a grain size of 3 to 4 μm with nickel plating to the side surface of the outer circumferential portion of the base 524. For example, the cutting edge 525 has a thickness of 30 μm and an outer diameter of 50 mm.

The imaging means 53 is mounted on a front end portion of the spindle housing 521 and includes illuminating means for illuminating the workpiece, an optical system for capturing an area illuminated by the illuminating means, and an imaging device (CCD) for imaging the area captured by the optical system. An image signal output from the imaging means 53 is transmitted to control means (not shown).

In performing the cut groove forming step by using the cutting apparatus 5 mentioned above, the semiconductor wafer 2 processed by the functional layer removing step is placed on the chuck table 51 in the condition where the dicing tape 30 is in contact with the chuck table 51 as shown in FIG. 8. Thereafter, suction means (not shown) is operated to hold the semiconductor wafer 2 through the dicing tape 30 on the chuck table 51 under suction (wafer holding step). Accordingly, the SiO$_2$ film 211 formed on the front side of the functional layer 21 of the semiconductor wafer 2 held on the chuck table 51 is oriented upward. Although the annular frame 3 supporting the dicing tape 30 is not shown in FIG. 8, the annular frame 3 is held by suitable frame holding means provided on the chuck table 51. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment step is performed by the imaging means 53 and the control means (not shown) to detect a subject area of the semiconductor wafer 2 to be cut. In this alignment step, the imaging means 53 images the laser processed groove 24 formed along each division line 23 of the semiconductor wafer 2 by the functional layer removing step. More specifically, the imaging means 53 and the control means perform image processing such as pattern matching for making the alignment of the cutting blade 523 and the laser processed groove 24 formed along each division line 23 extending in a first direction on the functional layer 21 of the semiconductor wafer 2, thus performing the alignment of a cut area by the cutting blade 523 (alignment step). Similarly, the alignment of a cut area by the cutting blade 523 is performed for the other laser processed groove 24 formed along each division line 23 extending in a second direction perpendicular to the first direction on the functional layer 21.

After performing the alignment step mentioned above to detect the laser processed groove 24 formed along each division line 23 of the semiconductor wafer 2 held on the chuck table 51, the chuck table 51 is moved to a cut start position in the cut area by the cutting blade 523, thereby positioning one end (left end as viewed in FIG. 9A) of a predetermined one of the division lines 23 on the right side of a position directly below the cutting blade 523 by a predetermined amount. Since the laser processed groove 24 formed along each division line 23 is directly imaged by the imaging means 53 to detect the cut area in the alignment step mentioned above, the lateral center position of the laser processed groove 24 formed along the predetermined division line 23 can be reliably set so as to be opposed to the outer circumference of the cutting blade 523.

Figure 9A:
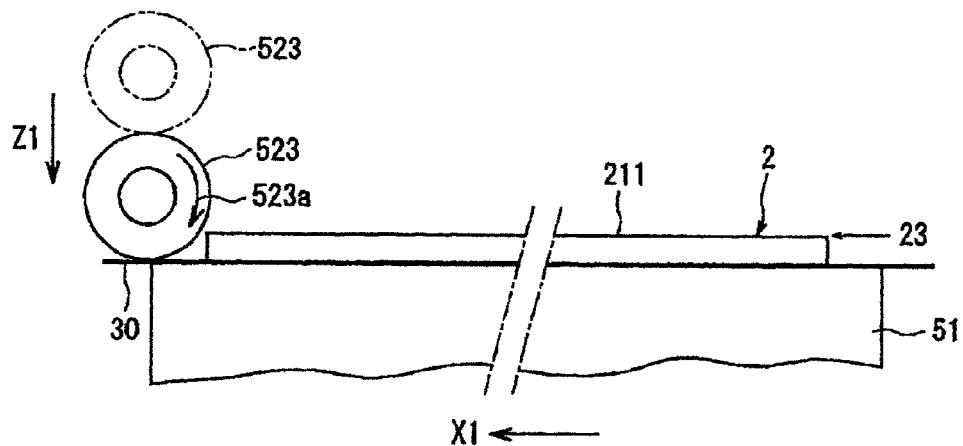
FIGS. 9A to 9D are views for illustrating a cut groove forming step as the third preferred embodiment of the wafer dividing step.
Figure 9B:
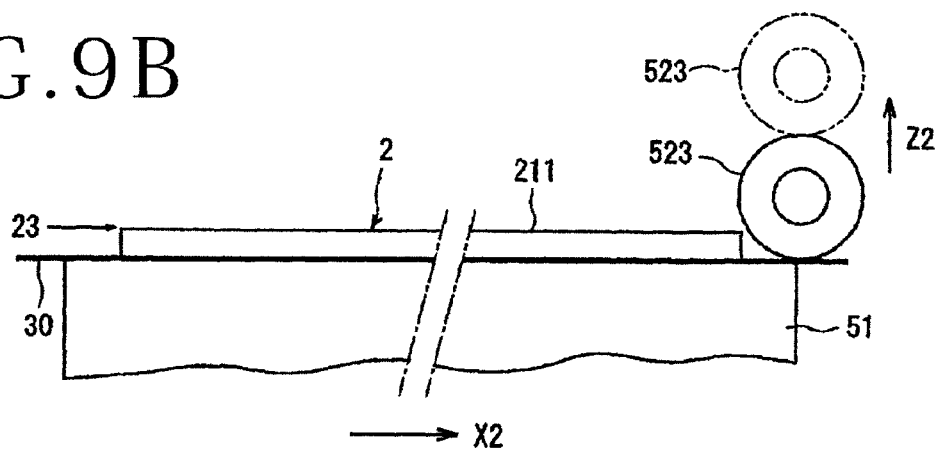
Figure 9C:
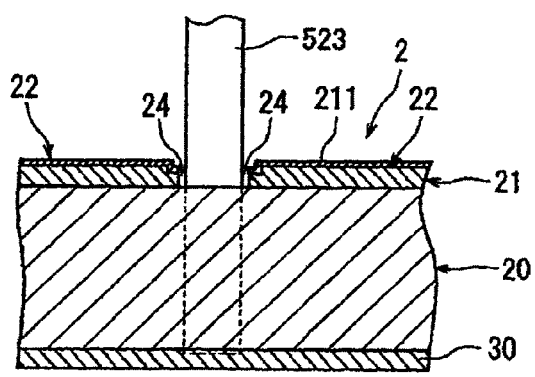

In the condition where the semiconductor wafer 2 held on the chuck table 51 is set at the cut start position in the cut area as described above, the cutting blade 523 is lowered from a standby position shown by a phantom line in FIG. 9A to a working position shown by a solid line in FIG. 9A as shown by an arrow Z1 in FIG. 9A. As shown in FIGS. 9A and 9C, this working position is set so that the lower end of the cutting blade 523 reaches the dicing tape 30 attached to the back side of the semiconductor wafer 2.

Figure 9D:
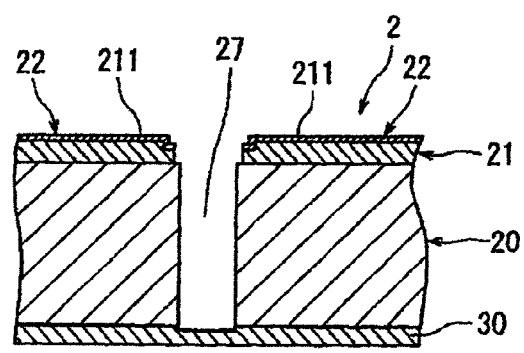

Thereafter, the cutting blade 523 is rotated in the direction shown by an arrow 523a in FIG. 9A at a predetermined rotational speed, and the chuck table 51 is moved in the direction shown by an arrow X1 in FIG. 9A at a predetermined feed speed. When the other end (right end as viewed in FIG. 9B) of the predetermined division line 23 reaches a position on the left side of the position directly below the cutting blade 523 by a predetermined amount as shown in FIG. 9B, the movement of the chuck table 51 is stopped. As a result, a cut groove 27 is formed in the substrate 20 of the semiconductor wafer 2 along the laser processed groove 24 formed along the predetermined division line 23 so that the depth of the cut groove 27 reaches the back side of the substrate 20 of the semiconductor wafer 2 as shown in FIG. 9D, thus fully cutting the substrate 20 over the entire thickness thereof (cut groove forming step).

Thereafter, the cutting blade 523 is raised from the working position to the standby position as shown by an arrow Z2 in FIG. 9B, and the chuck table 51 is next moved in the direction shown by an arrow X2 in FIG. 9B to the position shown in FIG. 9A. Thereafter, the chuck table 51 is moved in the direction (indexing direction) perpendicular to the sheet plane of FIG. 9A by an amount corresponding to the pitch of the division lines 23, thereby aligning the cutting blade 523 with the next division line 23 to be cut. In the condition where the cutting blade 523 is aligned with the next division line 23 to be cut as mentioned above, the cut groove forming step is performed similarly.

For example, the cut groove forming step mentioned above is performed under the following processing conditions.

Cutting blade: outer diameter: 50 mm, thickness: 30 μm
Rotational speed of the cutting blade: 20000 rpm
Cut feed speed: 50 mm/second The cut groove forming step mentioned above is performed similarly along all of the division lines 23 of the semiconductor wafer 2. As a result, the semiconductor wafer 2 is cut along all of the division lines 23 and thereby divided into the individual devices 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of crossing division lines formed on a front side of said wafer, said wafer including a substrate, a functional layer formed on the front side of said substrate, and an $SiO_2$ film formed on a front side of said functional layer, said individual devices being formed from said functional layer and partitioned by said division lines, said wafer processing method comprising:
   a functional layer removing step of applying a laser beam to said wafer along each division line to thereby remove said functional layer along each division line, said laser beam having an absorption wavelength to said $SiO_2$ film with high absorptivity due to the stretching vibration of an O—H bond or a C—H bond remaining in said $SiO_2$ film; and
   a wafer dividing step of processing said substrate along each division line where said functional layer has been removed by performing said functional layer removing step, thereby dividing said wafer into said individual devices.

2. The wafer processing method according to claim 1, wherein the wavelength of said laser beam to be applied in said functional layer removing step is set to 2.6 to 3.5 μm.

3. The wafer processing method according to claim 1, wherein said wafer dividing step comprises the step of applying a laser beam having an absorption wavelength to said substrate along each division line where said functional layer has been removed, thereby ablating said substrate to form a division groove on said substrate along each division line.

4. The wafer processing method according to claim 1, wherein said wafer dividing step comprises the step of applying a laser beam having a transmission wavelength to said substrate along each division line where said functional layer has been removed in the condition where a focal point of said laser beam is set inside said substrate, thereby forming a modified layer inside said substrate along each division line.

5. The wafer processing method according to claim 1, wherein said wafer dividing step comprises the step of aligning a cutting blade with each division line where said functional layer has been removed, thereby cutting said substrate along each division line.

* * * * *